(12) United States Patent
Matsukura et al.

(10) Patent No.: US 6,960,381 B2
(45) Date of Patent: Nov. 1, 2005

(54) PELLICLE

(75) Inventors: Ikuo Matsukura, Yokohama (JP); Naoko Shirota, Yokohama (JP); Nana Tsushima, Yokohama (JP); Kiyoshi Yamamoto, Yokohama (JP); Reiko Kakita, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/634,877

(22) Filed: Aug. 6, 2003

(65) Prior Publication Data

US 2004/0071899 A1 Apr. 15, 2004

(30) Foreign Application Priority Data

Aug. 23, 2002 (JP) ........................................ 2002-243867

(51) Int. Cl.⁷ ............................ B32B 3/02; B32B 27/00; G02B 1/04
(52) U.S. Cl. .......................... 428/45; 428/421; 359/350; 359/507
(58) Field of Search ................................ 359/350, 507, 359/892; 428/45, 421

(56) References Cited

U.S. PATENT DOCUMENTS

| | | | |
|---|---|---|---|
| 5,061,024 A | 10/1991 | Keys | ........................ 359/350 |
| 6,548,129 B2 | 4/2003 | Matsukura et al. | ........... 428/14 |
| 2001/0024701 A1 * | 9/2001 | Matsukura et al. | ........... 428/14 |

FOREIGN PATENT DOCUMENTS

| | | |
|---|---|---|
| WO | WO 01/37043 A1 | 5/2001 |
| WO | WO 01/37044 A1 | 5/2001 |

OTHER PUBLICATIONS

"Polymer Synthetic Chemistry", published on Aug. 10, 1995. pp. 14–15.
English translation of relevant portions of "Polymer Synthetic Chemistry".

* cited by examiner

*Primary Examiner*—Ramsey Zacharia
(74) *Attorney, Agent, or Firm*—Oblon, Spivak, McClelland, Maier & Neustadt, P.C.

(57) ABSTRACT

A pellicle is used for a photolithographic patterning process using a light having a wavelength of from 100 to 200 nm. The pellicle contains a pellicle membrane containing (A) a substantially linear fluoropolymer which has an alicyclic structure in its main chain, the main chain being a chain of carbon atoms, and the fluropolymer satisfying the following requirements (1) the carbon atoms in the main chain of the fluoropolymer contain a carbon atom having at least one hydrogen atom bonded thereto and a carbon atom having no hydrogen atom bonded thereto; and (2) in the measurement of a high resolution proton magnetic resonance spectrum of the fluoropolymer, a number of hydrogen atoms based on signals appearing on the higher magnetic field side higher than 2.8 ppm, is at most 6 mol % based on a total number of hydrogen atoms.

21 Claims, 3 Drawing Sheets

PELLICLE

BACKGROUND OF THE INVENTION

1. Field of the Invention

The present invention relates to a pellicle for photolithography using a light having a wavelength of from 100 to 200 nm.

2. Discussion of Background

A pellicle is a dustproof integral device to be mounted on a photomask or a reticle (hereinafter referred to as a mask) so as to prevent dust particles from depositing on the mask and to prevent pattern failure during exposure, used in photolithography as one step in production of semiconductor devices or liquid crystal display boards. Usually, it has a structure such that a transparent thin membrane bonded to a frame by an adhesive is mounted on the mask at some distance from the mask surface.

In fields of production of semiconductor devices and liquid crystal display panels in which such a pellicle is used, the wavelength of light sources to be used has been shortened rapidly also in photolithography, along with minimization of wiring and wiring interval. In a conventional exposure technique with a minimum pattern dimension of at least 0.3 $\mu$m, a process employing an i-beam light source (365 nm) has been mainly used, and as a material of a transparent thin membrane of a pellicle (hereinafter referred to as a pellicle membrane), a cellulose nitrate type material has been used.

In recent years, for a photolithographic patterning process with a minimum pattern dimension of less than 0.3 $\mu$m, a KrF excimer laser is being introduced, but its irradiation wavelength is 248 nm, and the cellulose nitrate type membrane material is inadequate in durability. Further, it has been found that an amorphous perfluoropolymer is effective as a membrane material in a case where a light having a short wavelength such as an excimer laser is employed (Japanese Patent No. 2951337 or Japanese patent No. 2952962).

On the other hand, for a photolithographic patterning process with a minimum pattern dimension of at most 0.2 $\mu$m under development in recent years, it has been proposed to use, as a laser having a short wavelength of from 100 to 200 nm, e.g. an argon fluoride excimer laser having a wavelength of 193 nm (hereinafter referred to as an ArF excimer laser) or a fluorine gas excimer laser having a wavelength of 157 nm (hereinafter referred to as a F$_2$ excimer laser).

However, these laser lights have an extremely high energy, whereby even the above amorphous perfluoropolymer as disclosed in Japanese Patent No. 2951337 is inadequate in durability. For example, "CYTOP" (tradename) which is a perfluoropolymer used in the above patent, has had a problem that the durability against such laser lights is not practically adequate although it has high transparency at 193 nm. Further, its light transmittance and durability suddenly decrease at a wavelength shorter than 170 nm, and its transmittance of the F$_2$ excimer laser light having a wavelength of 157 nm is very low.

Therefore, as a pellicle membrane which is durable against the F$_2$ excimer laser light, a fluoropolymer as disclosed in JP-A-2001-330943 or a polymer containing a perfluoro-1,3-dioxol as disclosed in W0200137044, has, for example, been proposed for a pellicle membrane or for an adhesive to bond the pellicle membrane to the frame.

However, with such a fluoropolymer, the durability is still not fully satisfactory although it has high transparency at 157 nm. Also the adhesive to fix the pellicle membrane to the frame has had a similar problem of degradation due to reflected light or scattering light of the laser. Thus, it has been desired to develop an adhesive having high durability.

SUMMARY OF THE INVENTION

As a result of an extensive study to solve the above problem, the present inventors have found that a certain specific structure of carbon atoms in the main chain of a fluoropolymer constituting a pellicle membrane presents an adverse effect to the durability and has accomplished the present invention on the basis of this discovery. Namely, the present inventors have found that a specific chain of carbon atoms which can be ascertained from the nuclear magnetic resonance spectrum, is the cause to deteriorate the durability against a laser light of from 100 to 200 nm (particularly from 150 to 180 nm) (hereinafter referred to as a short wavelength laser light). Accordingly, a fluoropolymer having substantially no such a carbon atom chain, has been found to have high durability against the short wavelength laser light. Thus, the present invention is the following invention relating to a pellicle wherein such a fluoropolymer is used as a pellicle membrane or as an adhesive.

A pellicle for a photolithographic patterning process by means of a light having a wavelength of from 100 to 200 nm, which has a pellicle membrane made of the following fluoropolymer (A).

A pellicle for a photolithographic patterning process by means of a light having a wavelength of from 100 to 200 nm, which comprises a pellicle membrane, a frame supporting the pellicle membrane, and an adhesive bonding the pellicle membrane to the frame, wherein the adhesive is made of the following fluoropolymer (A).

A pellicle for a photolithographic patterning process by means of a light having a wavelength of from 100 to 200 nm, which comprises a pellicle membrane, a frame supporting the pellicle membrane, and an adhesive bonding the pellicle membrane to the frame, wherein the pellicle membrane and the adhesive are made of the following fluoropolymer (A).

Fluoropolymer (A): a substantially linear fluoropolymer which has an alicyclic structure in its main chain, the main chain being a chain of carbon atoms, and which satisfies the following requirements (1) and (2):

(1) the carbon atoms in the main chain comprise a carbon atom having at least one hydrogen atom bonded thereto and a carbon atom having no hydrogen atom bonded thereto; and (2) in the measurement of its high resolution proton magnetic resonance spectrum, the number of hydrogen atoms based on signals appearing on the higher magnetic field side than 2.8 ppm, is at most 6 mol % based on the total hydrogen atoms.

The pellicle of the present invention is particularly suitable as a pellicle for exposure treatment with an excimer laser light having a wavelength of from 150 to 180 nm. Specifically, it is suitable as a pellicle for exposure treatment with a F$_2$ excimer laser having a wavelength of 157 nm.

DETAILED DESCRIPTION OF THE PREFERRED EMBODIMENTS

Figure 1:
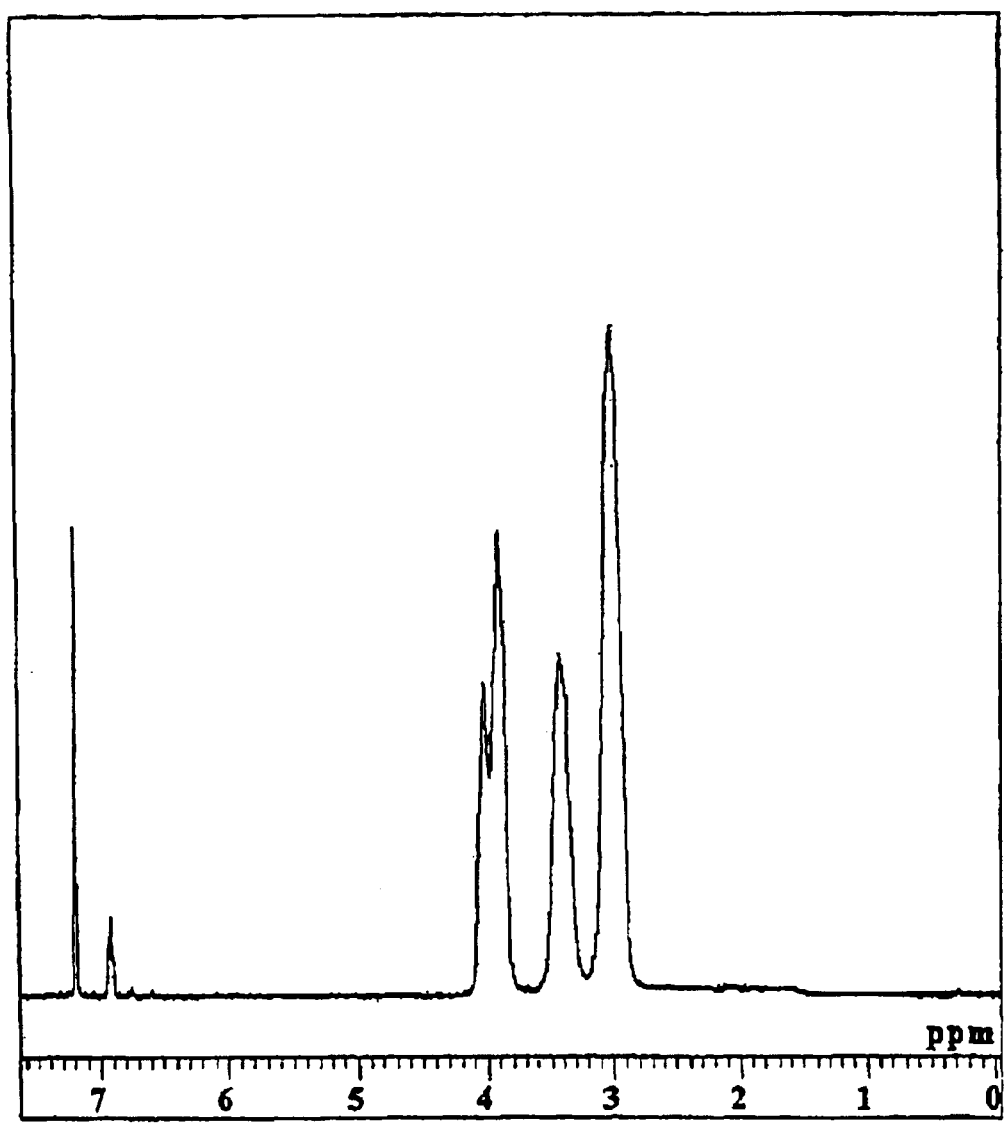
FIG. 1 is a spectrum chart showing the $^1$H-NMR spectrum of polymer (A-1).

In the present invention, a "linear" polymer is a polymer wherein a plurality of monomer units are linearly arranged, and it is a polymer which does not have a branch wherein a plurality of monomer units are arranged or a portion (cross linkage) where more than two polymer sections in which a plurality of monomer units are linearly arranged, are bonded at positions other than the terminal. Further, "the main chain" of this polymer means a portion constituting the linear line of the linear polymer. Further, the main chain "being a chain of carbon atoms" in this polymer, means that the main chain is constituted by a plurality of linearly arranged carbon atoms. Further, "a side chain" means an atom or an atomic group (a radical) bonded to a carbon atom in the main chain.

Further, in the present invention, the "alicyclic structure" in the polymer means a cyclic structure which has a ring structure constituted solely by carbon atoms or by carbon atoms and other atoms and which does not have a non-localized unsaturated double bond. As such other atoms, oxygen atoms are preferred. The number of atoms constituting the ring is preferably from 4 to 8, particularly preferably from 5 to 7.

In the present invention, "having an alicyclic structure in its main chain" being a chain of carbon atoms, means that at least one carbon atom constituting the alicyclic ring is a carbon atom in the main chain. A carbon atom in the main chain has two bonds to be bonded to side chains. Accordingly, in a case where one of carbon atoms constituting the alicyclic ring is a carbon atom in the main chain, a bivalent group is bonded to the one carbon atom in the main chain (the alicyclic ring is constituted by the carbon atom in the main chain and this bivalent group). In a case where two or more of carbon atoms constituting the alicyclic ring are carbon atoms in the main chain, a bivalent group is bonded to different two carbon atoms among the two or more carbon atoms in the main chain (in a case where the two carbon atoms in the main chain to which the bivalent group is bonded, are adjacent to each other, the alicyclic ring is constituted by the two carbon atoms and this bivalent group, and in a case where one or more carbon atoms in the main chain are present between the two carbon atoms in the main chain to which the bivalent group is bonded, the alicyclic ring is constituted by such three or more carbon atoms in the main chain and this bivalent group). In the present invention, such a bivalent group is also referred to as a side chain.

In the present invention, the linear polymer with the main chain being a chain of carbon atoms, can be obtained by addition polymerization of a monomer having an addition-polymerizable carbon-carbon double bond (hereinafter referred to as a polymerizable unsaturated group). As such a monomer, a monomer having one polymerizable unsaturated group (hereinafter referred to also as a monoene monomer) or a monomer having two or more polymerizable unsaturated groups, may be used.

As the monomer having two or more polymerizable unsaturated groups, a cyclic addition polymerizable (hereinafter referred to as cyclopolymerizable) monomer is used. As the monomer having two or more polymerizable unsaturated groups, particularly preferred is a cyclopolymerizable monomer having two polymerizable unsaturated groups. A cyclopolymerizable monomer having three or more polymerizable unsaturated groups (among the three or more polymerizable unsaturated groups, two polymerizable unsaturated groups usually undergo cyclopolymerization) may be used, but such a monomer usually has no more merit than the cyclopolymerizable monomer having two polymerizable unsaturated groups and is not a preferred monomer in the present invention. Further, it is also possible to use a monomer having two or more polymerizable unsaturated groups and being not cyclopolymerizable, but in the present invention, such a monomer has no particularly merit as compared with the cyclopolymerizable monomer or the monoene monomer, and is not a preferred monomer. Hereinafter, unless otherwise specifically mentioned, a cyclopolymerizable monomer having two polymerizable unsaturated groups will be referred to as a cyclopolymerizable diene monomer or simply as a diene monomer.

In the above-mentioned linear polymer with the main chain being a chain of carbon atoms, carbon atoms in the main chain are carbon atoms constituting a polymerizable unsaturated group. Namely, two carbon atoms constituting a polymerizable unsaturated group of a monoene monomer, or four carbon atoms constituting two polymerizable unsaturated groups of a diene monomer, are carbon atoms constituting the main chain.

The polymer "having an alicyclic structure in its main chain" contains a monomer unit having an alicyclic structure as at least some of the monomer units, and at least one of the two or four carbon atoms in the main chain contained in the monomer unit having the alicyclic structure (carbon atoms constituting a polymerizable unsaturated group in the monomer as described above), is a carbon atom constituting the alicyclic ring, as mentioned above. A monoene monomer to form a monomer unit having an alicyclic structure is one type of a monoene monomer having an alicyclic ring and is a cyclic aliphatic compound having a polymerizable unsaturated group between adjacent two carbon atoms constituting the alicyclic ring, or a cyclic aliphatic compound having a polymerizable unsaturated group between a carbon atom constituting the alicyclic ring and a carbon atom not constituting the aliphatic ring.

The diene monomer to form a monomer unit having an alicyclic structure is a diene monomer which forms alicyclic ring by cyclopolymerization, and the diene monomer itself may be a compound having no alicyclic structure. Such a diene monomer comprises two polymerizable unsaturated groups and a connecting group portion connecting the carbon atoms of such polymerizable unsaturated groups. When carbon atoms of the polymerizable unsaturated groups are represented by $C^{1a}$, $C^{1b}$, $C^{2a}$ and $C^{2b}$ and the two polymerizable unsaturated groups are represented by $C^{1a}=C^{1b}$ and $C^{2a}=C^{2b}$ (assuming that the carbon atoms at the molecular terminals are $C^{1a}$ and $C^{2a}$, and $C^{1b}$ and $C^{2b}$ are bonded via a connecting group), an alicyclic ring will be formed by cyclopolymerization by bonding of $C^{1a}$ and $C^{2a}$, bonding of $C^{1a}$ and $C^{2b}$, bonding of $C^{1b}$ and $C^{2a}$ or bonding of $C^{1b}$ and $C^{2b}$ (see the formulae (10-2) to (10-4) given hereinafter). In a case where $C^{1a}$ and $C^{2a}$, will be bonded, an alicyclic ring will be formed by $C^{1a}$, $C^{1b}$, $C^{2a}$, $C^{2b}$ and atoms of the connecting group, and bonds to be bonded to other monomer units, will be formed on $C^{1b}$ and $C^{2b}$. In a case where $C^{1a}$ and $C^{2b}$ will be bonded, an alicyclic ring will be formed by $C^{1a}$, $C^{1b}$, $C^{2b}$ and atoms of the connecting group, and bonds to be bonded to other monomer units will be formed on $C^{1b}$ and $C^{2a}$. In a case where $C^{1b}$ and $C^{2a}$ will be bonded, an alicyclic ring will be formed by $C^{1b}$, $C^{2a}$, $C^{2b}$ and atoms of the connecting group, and bonds to be connected to other monomer units will be formed on $C^{1a}$ and $C^{2b}$. In a case where $C^{1b}$ and $C^{2b}$ will be bonded, an alicyclic ring will be formed by $C^{1b}$, $C^{2b}$ and atoms of the connecting group, and bonds to be bonded to other monomer units will be formed on $C^{1a}$ and $C^{2a}$.

Among these four types of bondings, which bonding is likely to take place in the cyclopolymerization of a diene monomer, may vary depending upon the type of the diene monomer. However, with a usual diene monomer, bonding of $C^{1a}$ and $C^{2a}$ is unlikely to take place. Likeliness of other three types of bondings is considered to vary depending upon the type of the diene monomer. Accordingly, monomer unit structures having alicyclic structures which may be formed by cyclopolymerization of only one type of a diene monomer, may be two or more types. As mentioned above, $C^{1a}$, $C^{1b}$, $C^{2a}$ and $C^{2b}$ in a monomer unit are carbon atoms constituting the main chain, and among them, 2 to 4 carbon atoms may be carbon atoms constituting the alicyclic ring.

A monomer unit containing an alicyclic ring wherein the carbon atoms constituting the main chain as described above are carbon atoms constituting the alicyclic ring, will be hereinafter referred to as an alicyclic monomer unit.

The fluoropolymer (A) in the present invention is a substantially linear fluoropolymer which has an alicyclic structure in its main chain, the main chain being the chain of carbon atoms. It is a fluoropolymer, whereby at least some of monomer units in the polymer are monomer units having fluorine atoms. The fluorine atoms are bonded to at least any one of the carbon atoms in the main chain or the carbon atoms in the side chains. It is particularly preferred that the alicyclic monomer units contain fluorine atoms. Further, the fluoropolymer (A) may contain monomer units other than the alicyclic monomer units (hereinafter referred to as non-alicyclic monomer units). The non-alicyclic monomer units may have fluorine atoms and may have an alicyclic ring wherein carbon atoms constituting the main chain are not included as constituting atoms of the ring.

The non-alicyclic monomer units in the fluoropolymer (A) are usually monomer units derived from a monoene monomer other than the above-mentioned specific alicyclic ring-containing monoene monomer. Such a monoene monomer may be an alicyclic ring-containing monoene monomer other than the above-mentioned specific alicyclic ring-containing monoene monomer (one not containing carbon atoms of a polymerizable unsaturated group as atoms constituting the alicyclic ring), but it is preferably a monoene monomer having no alicyclic ring. Hereinafter, unless otherwise specified, the aliphatic ring-containing monoene monomer is meant for the above-mentioned specific alicyclic ring-containing monoene monomer (i.e. a cyclic aliphatic compound having a polymerizable unsaturated group between adjacent two carbon atoms constituting the alicyclic ring, and a cyclic aliphatic compound having a polymerizable unsaturated group between a carbon atom constituting the alicyclic ring and a carbon atom not constituting the alicyclic ring). Further, a comonomer will hereinafter be meant for a monoene monomer other than such an alicyclic ring-containing monoene monomer.

The cyclopolymerizable diene monomer can be copolymerized with an alicyclic ring-containing monoene monomer or the above-mentioned comonomer, and also in a case where it is copolymerized with such a monomer, the cyclopolymerizable diene monomer will be cyclopolymerized to form alicyclic monomer units.

The fluoropolymer (A) in the present invention is either a polymer obtained by polymerization of at least one monomer selected from alicyclic ring-containing monoene monomers and cyclopolymerizable diene monomers, or a polymer obtained by polymerization of at least one of such monomers and at least one of comonomers. The fluoropolymer (A) is a polymer having fluorine atoms, and, accordingly, at least one of starting material monomers is a monomer having a fluorine atom. It is particularly preferred that the alicyclic ring-containing monoene monomer and the cyclopolymerizable diene monomer are monomers having fluorine atoms. The comonomer may or may not have a fluorine atom. On the other hand, as mentioned hereinafter, it is necessary that the fluoropolymer (A) has a hydrogen atom on a carbon atom in the main chain. The alicyclic ring-containing monoene monomer or the cyclopolymerizable diene monomer may have a hydrogen atom on a carbon atom in a polymerizable unsaturated group, and in a case where such a monomer is a compound having no such hydrogen atom, it is necessary to use a comonomer having a hydrogen atom on a carbon atom in a polymerizable unsaturated group.

The fluoropolymer (A) in the present invention is a fluoropolymer which further satisfies the following requirements (1) and (2):

(1) the carbon atoms in the main chain comprise a carbon atom having at least one hydrogen atom bonded thereto and a carbon atom having no hydrogen atom bonded thereto; and (2) in the measurement of its high resolution proton magnetic resonance spectrum, the number of hydrogen atoms based on signals appearing on the higher magnetic field side than 2.8 ppm, is at most 6 mol % based on the total hydrogen atoms.

Heretofore, the present inventors have found that as a material for a pellicle membrane or for an adhesive in a pellicle for a photolithographic patterning process by means of a light having a wavelength of at most 200 nm, a fluoropolymer having in its main chain a carbon atom having a hydrogen atom bonded thereto and a carbon atom having a fluorine atom, etc. bonded thereto (preferably a substantially linear fluoropolymer with the main chain being a chain of carbon atoms and having an alicyclic structure in its main chain) is excellent in the transmittance of a light having a wavelength of at most 200 nm (see JP-A-2001-330943).

The fluoropolymer (A) in the present invention is required to have a high transmittance of a light having a wavelength of from 100 to 200 nm. Accordingly, like such a known fluoropolymer, it is required that the carbon atoms in the main chain comprise a carbon atom having at least one hydrogen atom bonded thereto and a carbon atom having no hydrogen atom bonded thereto (requirement (1)). Further, in order to satisfy the above-mentioned light transmittance, it is preferred that the number of hydrogen atoms bonded to carbon atoms in side chains of this fluoropolymer (A) is as small as possible. It is preferred that instead of hydrogen atoms, fluorine atoms are bonded to carbon atoms in the side chains. Accordingly, the fluoropolymer (A) is preferably a polymer having a high fluorine content. The proportion of the number of hydrogen atoms bonded to carbon atoms in the main chain, based on the total hydrogen atoms bonded to carbon atoms in the fluoropolymer (A), is suitably at least 25 mol %, preferably at least 50 mol %, more preferably at least 75 mol %. A particularly preferred fluoropolymer (A) is a polymer wherein substantially all of hydrogen atoms bonded to carbon atoms are hydrogen atoms bonded to carbon atoms in the main chain, i.e. a polymer containing substantially no hydrogen atoms bonded to carbon atoms in the side chains.

Further, with respect to the carbon atoms in the main chain in the fluoropolymer (A), the number of carbon atoms having no hydrogen atom bonded thereto, based on the total number of carbon atoms having hydrogen atoms bonded thereto and carbon atoms having no hydrogen atom bonded thereto, is suitably from 35 to 85%, preferably from 45 to 80%. If the number of carbon atoms having no hydrogen atom bonded thereto is higher or lower than this proportion, the transmittance of a light having a wavelength of from 100 to 200 nm, tends to be inadequate, and if it is lower than this proportion, the polymer tends to be a polymer poor in the durability, as mentioned hereinafter.

The present inventors have further found that the above-mentioned known fluoropolymer is excellent in the transmittance of a light having a wavelength of from 100 to 200 nm, but its durability against a light having a wavelength of from 100 to 200 nm is not yet adequate. The durability being not adequate is considered to be attributable to the breakage of the main chain of the fluoropolymer which is caused by the light having a wavelength of from 100 to 200 nm. The breakage of the main chain is considered to be caused by a chain structure of specific hydrogen atom-bonded carbon atoms among the hydrogen atom-bonded carbon atoms. The present inventors have found that such a chain structure can be confirmed by a high resolution proton magnetic resonance spectrum (hereinafter referred to also as a NMR spectrum), and a fluoropolymer whereby in its NMR spectrum, signals appear on the higher magnetic field side (the smaller numerical value side) than 2.8 ppm, has no adequate durability. By the signals appearing on the higher magnetic field side than 2.8 ppm, the proportion of hydrogen atoms (protons) showing the signals based on the total number of hydrogen atoms, can be quantitatively analyzed. With the fluoropolymer (A) in the present invention, it is required that the proportion of such specific hydrogen atoms is at most 6 mol % (requirement (2)). The fluoropolymer in which this proportion exceeds 6 mol %, has no adequate durability against a light having a wavelength of from 100 to 200 nm.

A more preferred fluoropolymer (A) is a fluoropolymer in which the proportion of the above-mentioned specific hydrogen atom is at most 5 mol %, particularly preferably at most 3 mol %. The most preferred fluoropolymer (A) is a fluoropolymer whereby substantially no signal appears on the higher magnetic field side than 2.8 ppm.

Hydrogen atoms to be detected by the NMR spectrum are hydrogen atoms bonded to carbon atoms in the main chain and hydrogen atoms bonded to carbon atoms in side chains, and it is difficult to distinguish the two types of hydrogen atoms. Accordingly, in a case where the above-mentioned specific hydrogen atoms are present mainly in the side chains, they may not be directly influential over the breakage of the main chain of the fluoropolymer. However, as mentioned above, the fluoropolymer (A) in the present invention is preferably a polymer wherein hydrogen atoms bonded to carbon atoms in side chains are as little as possible. Accordingly, with a polymer, wherein hydrogen atoms bonded to carbon atoms in side chains are little, the above-mentioned specific hydrogen atoms being little is considered to be sufficiently related to the durability of the polymer attributable to breakage of the main chain. Further, breakage of side chain is also considered to be one of causes for deterioration of the durability of the fluoropolymer. Accordingly, also with a polymer in which hydrogen atoms bonded to carbon atoms in side chains are present to some extent, the polymer in which the above-mentioned specific hydrogen atoms are little, is considered to have high durability.

In the NMR spectrum, signals appearing on the higher magnetic field side than 2.8 ppm are considered to represent a specific chain structure of carbon atoms having hydrogen atoms bonded thereto. Such a chain structure is considered to be as follows, and it is theoretically understood that such a chain structure portion is susceptible to breakage between carbon atoms by a light having a wavelength of from 100 to 200 nm.

The above-mentioned specific chain structure is a chain of the following two Ch carbon atoms (provided that the adjacent carbon atoms in the chain are the specific hydrogen atom-bonded carbon atoms) or a chain of the following three or more Ch carbon atoms. The Ch carbon atom is a carbon atom having a hydrogen atom and $R^1$ bonded thereto, as represented by —CH($R^1$)— (wherein $R^1$ is a hydrogen or an organic group having a methylene group at the bond terminal). The specific chain structure is a structure represented by the following formula (1) or (2) of Ch carbon atoms. Here, R2 represents an atom or an organic group other than $R^1$, and for example, it may be a fluorine atom or a perfluoroalkyl group. However, an organic group having a methylene group at the bond terminal bonded to a carbon atom having no hydrogen atom bonded thereto, is $R^2$. Further, $C^h$ represents a Ch carbon atom, and m represents an integer of at least 3.

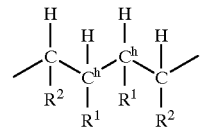

(1)

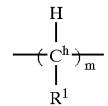

(2)

$R^1$ is usually a hydrogen atom. In a case where $R^1$ is an organic group, and in the above formula (1) or (2), carbon atoms are carbon atoms in the main chain, $R^1$ is a side chain having a hydrogen atom and, as mentioned above, such is not a preferred side chain in the fluoropolymer (A). In the fluoropolymer (A), $R^1$ other than a hydrogen atom, is usually a methyl group. $R^2$ is usually a fluorine atom, a perfluoroalkyl group or a bivalent organic group having no hydrogen atom. The bivalent organic group having no hydrogen atom is usually a perfluoroalkylene group which may have an oxygen atom at one terminal end, at both terminal ends or between carbon atoms. As shown by the above formula (1), if the carbon atom on one side or each side adjacent to the chain of two Ch carbon atoms, is a carbon atom having no hydrogen atom bonded thereto, such is not the above-mentioned specific chain structure. Further, among two carbon atoms in a polymerizable unsaturated group in a monomer, the carbon group which will become a Ch carbon atom by polymerization, will be hereinafter referred to also as a Ch carbon atom. Further, the specific structural portion of Ch carbon atoms represented by the above formula (1) or (2) will hereinafter be referred to as a Ch block.

The signals appearing on the higher magnetic field side than 2.8 ppm in the NMR spectrum are considered to represent the presence of a hydrogen atom bonded to a Ch carbon atom sandwiched between two hydrogen atom-bonded carbon atoms (provided that at least one of them is a Ch carbon atom). Accordingly, by measuring and quantifying the signals on the higher magnetic field than 2.8 ppm, the presence and the amount of the Ch blocks can be detected. On the other hand, it is considered that when Ch blocks are present in the fluoropolymer (A), the carbon-hydrogen bonds in the chain portions tend to be readily dissociated by a light having a wavelength of from 100 to 200 nm. It is expected that as a result of such dissociation, hydrogen atoms in such chain portions are withdrawn to form unsaturated groups between carbon atoms in the main chain, and such unsaturated groups will be the cause for breakage of the main chain.

In a case where carbon atoms of a Ch block represented by the above formula (1) or (2) represent carbon atoms of the main chain, m is 3 or 4, and such Ch blocks will be formed from two polymerizable unsaturated groups. A monoene monomer having a Ch carbon atom in a polymerizable unsaturated group may be a monomer having a structure of the following formula (3), (4) or (5). Further, a monoene monomer having a hydrogen atom on a carbon atom in a polymerizable unsaturated group and having no Ch carbon atom may be a monomer having a structure of the following formula (6) or (7). A monoene monomer having no hydrogen atom on carbon atoms in a polymerizable unsaturated group may be a monomer having a structure of the following formula (8). Hereinafter, the monomers represented by the respective formulae will be referred to as monomer (3), etc. Here, two $R^1$ (or from 2 to 4 $R^2$) in one molecule may be different from each other. For example, in a case where each $R^1$ is a hydrogen atom and each $R^2$ is a fluorine atom, specific examples of the monomers represented by the above formulae (3) to (8), may, sequentially, be ethylene, vinyl fluoride, vinylidene fluoride, 1,2-difluoroethylene, trifluoroethylene and tetrafluoroethylene.

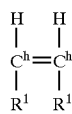

(3)

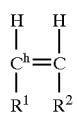

(4)

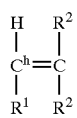

(5)

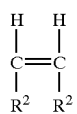

(6)

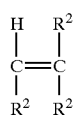

(7)

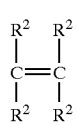

(8)

With respect to homopolymers of monomers (3) to (8), the homopolymer of monomer (3) always has Ch blocks, the homopolymer of monomer (4) may have Ch blocks, and the respective homopolymers of monomers (5) to (8) have no Ch blocks. In the case of the homopolymer of monomer (4), there may be a case where bonding between its two molecules is a head-to-tail bond which takes place between a Ch carbon atom and a carbon atom which is not a Ch carbon atom, or a case where the bonding is a hand-to-hand bond which takes place between two Ch carbon atoms. In the latter case, a Ch block will be formed.

In the case of a copolymer of monomer (3) (on the assumption that monomer (3) and another monomer will alternately be bonded), its copolymer with monomer (4), (5) or (6) will also have Ch blocks, its copolymer with monomer (7) may have Ch blocks, and its copolymer with monomer (8) will have no Ch blocks. However, in a case where it is possible that two or more molecules of monomer (3) will be directly connected, even a copolymer of monomer (3) with monomer (8) may have Ch blocks.

In the case of a copolymer of monomer (4) (on the assumption that monomer (4) and any one of monomers (5) to (8) will alternately be bonded), its copolymer with any one of monomers (5) to (8) will not have Ch blocks. However, in a case where it is possible that two or more molecules of monomer (4) will be directly bonded, there will be a possibility that Ch blocks will be formed, whereby such a copolymer may have Ch blocks.

In the case of a copolymer of monomer (5) (on the assumption that monomer (5) and any one of monomers (6) to (8) will alternately be bonded), no Ch blocks will be formed, and even if two ore more molecules of monomer (5) will be directly bonded, no Ch blocks will be formed, whereby such a copolymer will have no Ch blocks. Further, a copolymer of monomer (6) with monomer (7) or with monomer (8), or a copolymer of monomer (7) with monomer (8), will have no Ch blocks, since such monomers have no Ch carbon atom.

With respect to the above homopolymers and copolymers, a combination of monomers whereby Ch blocks will always be formed, is unsuitable. It is possible to reduce the amount of Ch blocks by changing some of hydrogen atoms in the polymer to fluorine atoms by a post fluorination method as described hereinafter, but it is difficult to convert a polymer having a large amount of Ch blocks to a polymer having a small amount of Ch blocks by the post fluorination method (since the fluoropolymer (A) requires the presence of hydrogen atoms to some extent).

On the other hand, the fluoropolymer (A) requires a carbon atom having no hydrogen atom bonded thereto, as a carbon atom in the main chain. Accordingly, it is required to be a homopolymer of monomer (5) or (7) or a copolymer of such a monomer with another monomer, or a copolymer of monomer (8) with another monomer. Accordingly, a fluoropolymer (A) may be a homopolymer of monomer (5), a copolymer of monomer (5) with any one of monomers (6) to (8), a copolymer of monomer (6) with monomer (7) or (8), a homopolymer of monomer (7), or a copolymer of monomer (7) with monomer (8). In such a case, no Ch blocks will be formed. Further, in the case of a copolymer of monomer (3) with monomer (7) or (8), or a copolymer of monomer (4) with monomer (5), (7) or (8), Ch blocks may be formed, but a fluoropolymer (A) can be obtained.

A diene monomer may be deemed to be a monomer having two molecules of the above monomers (3) to (8) bonded to each other, and its polymerization may be deemed to be alternating copolymerization of the two molecules. The two molecules preferably has a structure wherein $R^2$ are bonded to each other. In a case of a structure wherein two $R^1$ which are not hydrogen atoms, are bonded to each other, or $R^1$ which is not a hydrogen atom, and $R^2$, are bonded to each other, such will be a structure wherein a hydrogen atom is present in a side chain and thus will not be a preferred diene monomer. Further, as a diene monomer having a high cyclopolymerizability, it is preferred that at least one of the polymerizable unsaturated groups, is constituted by two carbon atoms having no hydrogen atom bonded thereto, i.e. it has a structure of monomer (8).

If a diene monomer is represented by a structure in which two molecules of monomers (4) to (8) are bonded via the respective $R^2$, four types i.e. diene monomer (4)/(8) (which represents a diene monomer of a structure wherein monomer (4) and monomer (8) are bonded via $R^2$, the same applies hereinafter), diene monomer (5)/(8), diene monomer (6)/(8) and diene monomer (7)/(8) are preferred diene monomers. Diene monomer (8)/(8) has no hydrogen atom, and may be used in a case where it is copolymerized with a monomer wherein a hydrogen atom is bonded to a carbon atom in a polymerizable unsaturated group.

With respect to homopolymers of the above four types of diene monomers, Ch blocks may be formed in the case of the homopolymer of diene monomer (4)/(8), and no Ch blocks will be formed in the case of homopolymers of other three types of diene monomers. In the case of a copolymer of two different types of diene monomers among the above four types of diene monomers, Ch blocks may be formed in the case of a copolymer of diene monomer (4)/(8) with another diene monomer, but Ch blocks will not be formed in the case of a copolymer of other two types of diene monomers. In the case of a copolymer of the above diene monomer with the above-mentioned monoene monomer i.e. any one of monomers (3) to (8), the combination of the monoene monomer and at least one of unsaturated groups in the diene monomer, may be considered to be the same as the above-mentioned combination of two types of the monoene monomers. For example, in the case of a copolymer of monomer (3) with diene monomer (7)/(8) or diene monomer (8)/(8), or a copolymer of monomer (4) with one of the above-mentioned five types of diene monomers, Ch blocks may be formed. On the other hand, for example, by a combination of monomer (6) and diene monomer (4)/(8), a fluoropolymer (A) can be obtained, as diene monomer (4)/(8) contains a carbon atom having no hydrogen atom bonded thereto.

The fluoropolymer (A) in the present invention is a polymer obtained from a monomer whereby Ch blocks may be formed, and yet, as mentioned above, it is a polymer having substantially no Ch blocks. Further, as mentioned above, a polymer obtained from a monomer whereby from its molecular structure, Ch blocks will always be formed, is not preferred. As a monomer whereby Ch blocks may be formed, monomer (3), monomer (4) or diene monomer (4)/(8) may be mentioned, as described above. Monomer (3) may be copolymerized with monomer (7) or with diene monomer (7)/(8) or (8)/(8), to obtain a fluoropolymer (A), wherein Ch blocks may be formed. Monomer (4) or diene monomer (4)/(8) may be subjected to homopolymerization of each monomer or copolymerization of such monomers, or copolymerization of such a monomer with monomer (5) or diene monomer (5)/(8), copolymerization of such a monomer with monomer (7) or diene monomer (7)/(8), or copolymerization of such a monomer with monomer (8) or diene monomer (8)/(8), to obtain a fluoropolymer (A), wherein Ch blocks may be formed.

The fluoropolymer (A) is a polymer having an alicyclic ring in its main chain. Accordingly, it is a homopolymer or copolymer obtained by cyclopolymerization of at least one type of a cyclopolymerizable diene monomer (hereinafter referred to as diene monomer (a)), a copolymer of diene monomer (a) with a comonomer, a homopolymer or copolymer of at least one type of the above-mentioned specific alicyclic group-containing monoene monomer (a monomer in which at least one of carbon atoms in a polymerizable unsaturated group is a carbon atom constituting an alicyclic ring, which will be hereinafter referred to as monomer (b)), a copolymer of monomer (b) with a comonomer, or a copolymer of diene monomer (a) with monomer (b) (and a comonomer). Alicyclic monomer units (i.e. the sum of monomer units derived from diene monomer (a) and monomer units derived from monomer (b)) based on the total monomer units in the fluoropolymer (A), are preferably at least 20 mol %, more preferably at least 30 mol %, most preferably at least 50 mol %. In the present invention, a copolymer means not only a two-component polymer obtained by copolymerization of two types of monomers, but also an at least 3-component polymer obtained by copolymerization of at least three types of monomers.

The diene monomer (a) is preferably a monomer represented by the following formula (10):

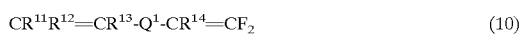

$$CR^{11}R^{12}=CR^{13}-Q^1-CR^{14}=CF_2 \qquad (10)$$

In the formula (10), each of $R^{11}$, $R^{12}$, $R^{13}$ and $R^{14}$ which are independent of one another, is a hydrogen atom, a fluorine atom or a monovalent fluorinated organic group, and $Q^1$ is a bivalent fluorinated organic group. The monovalent fluorinated organic group is preferably a perfluoroalkyl group having at most two carbon atoms. Each of $R^{11}$ and $R^{12}$ which are independent of each other, is preferably a hydrogen atom or a fluorine atom. $R^{13}$ is preferably a hydrogen atom, a fluorine atom or a perfluoroalkyl group having at most two carbon atoms, particularly preferably a hydrogen atom or a fluorine atom. $R^{14}$ is preferably a fluorine atom or a perfluoroalkyl group having at most two carbon atoms, particularly preferably a fluorine atom.

$Q^1$ is preferably a perfluoroalkylene group which has at most 10 carbon atoms and which may have an etheric oxygen atom. The etheric oxygen atom may be present at one or each of the terminals of the perfluoroalkylene group or between carbon atoms. In the case of a perfluoroalkylene group having no etheric oxygen atom, the carbon number is preferably from 2 to 6. In the case of a perfluoroalkylene group having an etheric oxygen atom at one terminal or between carbon atoms, the carbon number is preferably from 1 to 4. In the case of a perfluoroalkylene group having an etheric oxygen atom at each terminal, the carbon number is preferably from 1 to 3. The total number of carbon atoms and oxygen atoms excluding carbon atoms in a branched portion, is most preferably from 2 to 4.

$Q^1$ is preferably a perfluoroalkylene group having at most 4 carbon atoms, which has an etheric oxygen atom at the 2,2-difluorovinyl group side terminal, a perfluoroalkylene group having at most 4 carbon atoms, which has an etheric oxygen atom between carbon atoms, or a perfluoroalkylene group having at most 4 carbon atoms, which has no etheric oxygen atom. More preferably, $Q^1$ is a perfluoroalkylene group having at most 4 carbon atoms, which has an etheric oxygen atom at the 2,2-difluorovinyl group side terminal.

Among monomers represented by the above formula (10), a more preferred monomer is a monomer represented by the following formula (11):

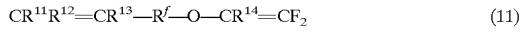

$$CR^{11}R^{12}=CR^{13}-R^f-O-CR^{14}=CF_2 \qquad (11)$$

In the formula (11), $R^{11}$, $R^{12}$, $R^{13}$ and $R^{14}$ are the same as defined in the above formula (10), and $R^f$ represents a $C_{1-4}$ perfluoroalkylene group. $R^f$ is preferably a perfluoroalkylene group having from 1 to 3 carbon atoms excluding branches. In a case where a branch is present, such a branch is preferably a trifluoromethyl group, and the number of branches is preferably 1 or 2.

As described above, when the four carbon atoms in a polymerizable unsaturated group of diene monomer (a) are represented by $C^{1a}$ to $C^{2b}$, the skeleton of the above formula (10) excluding side chain groups may be represented by the following formula (10-1), and monomer units to be formed by cyclopolymerization of such a monomer may be represented by the following formulae (10-2), (10-3) and (10-4) (a monomer unit to be formed by bonding of $C^{1a}$ and $C^{2a}$ is omitted).

$$C^{1a}=C^{1b}\text{-}Q^1\text{-}C^{2b}=C^{2a} \quad (10\text{-}1)$$

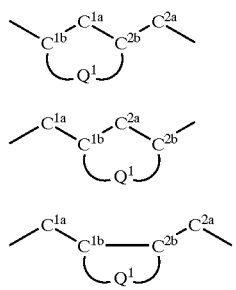

(10-2)

(10-3)

(10-4)

Among diene monomers (a) represented by the formula (11), the above-mentioned diene monomers (4)/(8) to (8)/(8) are preferably diene monomers represented by the following formulae (11-1) to (11-6), wherein $R^{15}$ is a fluorine atom or a trifluoromethyl group, preferably a fluorine atom.

Diene monomer (4)/(8):

$$CH_2=CH-R^f-O-CR^{15}=CF_2 \quad (11\text{-}1)$$

Diene monomer (5)/(8):

$$CH_2=CF-R^f-O-CR^{15}=CF_2 \quad (11\text{-}2)$$

Diene monomer (6)/(8):

$$CFH=CH-R^f-O-CR^{15}=CF_2 \quad (11\text{-}3)$$

Diene monomer (7)/(8):

$$CF_2=CH-R^f-O-CR^{15}=CF_2 \quad (11\text{-}4)$$

$$CFH=CF-R^f-O-CR^{15}=CF_2 \quad (11\text{-}5)$$

Diene monomer (8)/(8):

$$CF_2=CF-R^f-O-CR^{15}=CF_2 \quad (11\text{-}6)$$

The following compounds may, for example, be mentioned as specific examples of the diene monomer (a). However, the diene monomer (a) is not limited thereto.
$CH_2=CHCF_2CF_2OCF=CF_2$
$CH_2=CHCF_2CF_2CF_2OCF=CF_2$
$CH_2=CHCF_2OCF=CF_2$
$CH_2=CHCF(CF_3)CF_2OCF=CF_2$
$CH_2=CHCF_2OCF_2CF=CF_2$
$CH_2=CFCF_2CF_2OCF=CF_2$
$CH_2=CFCF(CF_3)CF_2OCF=CF_2$
$CFH=CHCF_2CF_2OCF=CF_2$
$CFH=CHCF(CF_3)CF_2OCF=CF_2$
$CF_2=CHCF(CF_3)CF_2OCF=CF_2$
$CF_2=CHCF_2CF_2OCF=CF_2$
$CF_2=CHCF(CF_3)CF_2OCF=CF_2$
$CF_2=CFCF_2CF_2OCF=CF_2$
$CF_2=CFCF_2CF_2CF_2OCF=CF_2$
$CF_2=CFCF_2CF(CF_3)OCF=CF_2$
$CF_2=CFCF_2OCF=CF_2$
$CF_2=CFCF(CF_3)OCF=CF_2$
$CF_2=CFC(CF_3)_2OCF=CF_2$
$CF_2=CFCF(CF_3)CF_2OCF=CF_2$
$CF_2=CFOCF_2OCF=CF_2$
$CF_2=CFOC(CF_3)_2OCF=CF_2$ Monomer (b) is preferably a monomer represented by the following formula (20) or (21).

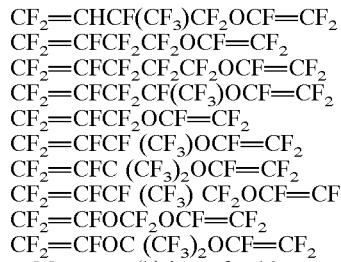

(20)

(21)

In the formulae (20) and (21), each of $R^{21}$, $R^{22}$, $R^{23}$ and $R^{24}$ which are independent of one another, is a hydrogen atom, a fluorine atom or a monovalent fluorinated organic group, and each of $Q^2$ and $Q^3$ which are independent of each other, is a bivalent fluorinated organic group. The monovalent fluorinated organic group is preferably a perfluoroalkyl group having at most 4 carbon atoms. Each of $R^{21}$ and $R^{22}$ which are independent of each other, is preferably a hydrogen atom, a fluorine atom or a perfluoroalkyl group having at most 2 carbon atoms. Each of $R^{23}$ and $R^{24}$ which are independent of each other, is preferably a hydrogen atom or a fluorine atom.

Each of $Q^2$ and $Q^3$ which are independent of each other, is preferably a perfluoroalkylene group having at most 10 carbon atoms, which may have an etheric oxygen atom. The etheric oxygen atom may be present at one terminal or each terminal, or between carbon atoms, of the perfluoroalkylene group. In the case of a perfluoroalkylene group having no etheric oxygen atom, the carbon number is preferably from 2 to 6. In the case of a perfluoroalkylene group having an etheric oxygen atom at one terminal or between carbon atoms, the carbon number is preferably from 1 to 4. In the case of a perfluoroalkylene group having an etheric oxygen atom at each terminal, the carbon number is preferably from 1 to 3. The total number of carbon atoms and oxygen atoms excluding carbon atoms in branches, is most preferably from 2 to 4.

$Q^2$ is more preferably a perfluoroalkylene group having at most 4 carbon atoms, which has an etheric oxygen atom at each terminal, particularly preferably a perfluoroalkylene group having 1 or 2 carbon atoms, which has an etheric oxygen atom at each terminal. $Q^3$ is more preferably a perfluoroalkylene group having at most 4 carbon atoms, which has an etheric oxygen atom at each terminal, particularly preferably a perfluoroalkylene group having 2 or 3 carbon atoms, which has an etheric oxygen atom at each terminal and which has no or at least one perfluoroalkyl group having at most 2 carbon atoms as a side chain.

When $Q^2$ or $Q^3$ is the above-mentioned perfluoroalkylene group which may have an etheric oxygen atom, monomer (b) represented by the formula (20) is a monomer which can be the above monomer (6), (7) or (8), and monomer (b) represented by the formula (21) is a monomer which can be the above monomer (5), (7) or (8). However, taking into consideration the efficiency for preparation of the monomer or economical availability, each of $R^{21}$ to $R^{24}$ is usually a fluorine atom or a perfluoroalkyl group. Accordingly, the monomer represented by the formula (20) or (21) is usually the above monomer (8).

Thus, among the monomers represented by the above formulae (20) and (21), preferred are monomers represented by the following formulae (22), (23) and (24), wherein each of $R^{25}$, $R^{26}$, $R^{27}$, $R^{28}$, $R^{29}$, $R^{30}$, $R^{31}$ and $R^{32}$ which are independent of one another, is a fluorine atom or a perfluoroalkyl group having at most 2 carbon atoms. Particularly, each of $R^{26}$ and $R^{27}$ is preferably a trifluoromethyl group, and each of $R^{25}$ and $R^{28}$ to $R^{32}$ is preferably a fluorine atom. Among them, a particularly preferred monomer is perfluoro (2,2,-dimethyl-1,3-dioxol), perfluoro(2-methylene-1,3-dioxolane) or perfluoro(2-methylene-4-methyl-1,3-dioxolane).

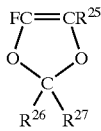
(22)

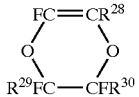
(23)

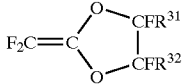
(24)

The comonomer (a monomer other than the above-mentioned diene monomer (a) and monomer (b)) may, for example, be an olefin or fluoroolefin having from 2 to 4 carbon atoms, a perfluoro(alkyl vinyl ether) having from 3 to 6 carbon atoms or a (perfluoroalkyl)vinyl ether having from 3 to 6 carbon atoms. Specifically, it may, for example, be an olefin such as ethylene, propylene or isobutylene, a fluoroolefin such as vinyl fluoride, vinylidene fluoride, 1,2-difluoroethylene, trifluoroethylene, tetrafluoroethylene, 3,3,3-trifluoromethylpropene, 2-trifluoromethyl-3,3,3-trifluoromethylpropene or hexafluoropropylene, a perfluoro (alkyl vinyl ether) represented by $CF_2=CFOR^F$ or a (perfluoroalkyl)vinyl ether represented by $CH_2=CHOR^F$ (wherein $R^F$ represents a perfluoroalkyl group having from 1 to 4 carbon atoms).

As mentioned above, the above-mentioned diene monomer (4)/(8) may be mentioned as a monomer which may form Ch blocks among monomers to present alicyclic monomer units. As such a monomer, a diene monomer represented by the above formula (11-1) is preferred. This diene monomer represented by the formula (11-1) will be hereinafter referred to as a diene monomer (a-1). This diene monomer can be used in combination with another monomer, and as such another monomer, a diene monomer (a) other than the diene monomer (a-1), monomer (b) or a comonomer, may, for example, be mentioned. On the other hand, as monomer (b) being a monomer to present alicyclic monomer units, no proper monomer other than monomer (8) is available. Accordingly, a combination of a monomer represented by any one of the formulae (22) to (24) being such monomer (8) and a comonomer represented by the formula (3) or (4), will be a monomer which may form Ch blocks. The monomer represented by any one of the formulae (22) to (24) will be hereinafter referred to as monomer (b-1).

Accordingly, the fluoropolymer (A) in the present invention is preferably a polymer of at least one type of diene monomer (a-1), a copolymer of diene monomer (a-1) with monomer (b-1), or a copolymer of diene monomer (a-1) with a comonomer. As the comonomer, a fluorinated monoene monomer having no or one Ch carbon atom, may be used. The next preferred fluoropolymer (A) is copolymer of a monomer (b-1) with a comonomer being monomer (3) (provided that the amount of monomer (b-1) is at least 50 mol %) or a copolymer of monomer (b-1) with a comonomer being monomer (4). In such a case, the amount of monomer (b-1) based on the total monomers is preferably from 50 to 80 mol %.

The most preferred fluoropolymer (A) in the present invention is a homopolymer obtained by polymerizing diene monomer (a-1) substantially solely, a copolymer of diene monomer (a-1) and monomer (b-1), or a copolymer of diene monomer (a-1) and a comonomer represented by the formula (5) or (8), which satisfies the above requirement (2). The comonomer represented by the formula (5) is preferably vinylidene fluoride, and the comonomer represented by the formula (8) is preferably tetrafluoroethylene or a perfluoro (alkyl vinyl ether). In the case of a copolymer of diene monomer (a-1) and monomer (b-1), the amount of diene monomer (a-1) based on the total amount of both monomers, is preferably at least 45 mol %, particularly preferably at least 50 mol %. Further, in the case of a copolymer of diene monomer (a-1) and a comonomer represented by the formula (5), the amount of diene monomer (a-1) based on the total amount of both monomers, is preferably at least 30 mol %, particularly preferably at least 50 mol %. In the case of a copolymer of diene monomer (a-1) and a comonomer represented by the formula (8), the amount of diene monomer (a-1) based on the total amount of both monomers, is preferably at least 45 mol %, particularly preferably at least 50 mol %.

As a method for producing a fluoropolymer (A) having little Ch blocks by using a monomer as described above, a method of polymerizing a monomer under such a polymerization condition that a head-to-head bond will hardly be formed, may be employed. For example, there may be a method for obtaining a polymer having little head-to-head structure of monomer units by carrying out the polymerization under a mild condition, such as a method for carrying out the polymerization at a relatively low temperature or a method for carrying out the polymerization under a low monomer concentration condition. Particularly preferred is a method for carrying out the polymerization at a low temperature. In the polymerization employing diene monomer (a-1), the polymerization may be carried out at a polymerization temperature of at most 15° C. to obtain a fluoropolymer (A) which satisfies the above requirement (2). Further, if the polymerization temperature is too low, the polymerization time tends to be extremely long. Accordingly, the lower limit of the polymerization temperature is preferably −10° C. A preferred polymerization temperature is from 0 to 15° C. the monomer concentration is suitably from 5 to 50 mass %, particularly preferably from 5 to 20 mass %.

Further, even if a fluoropolymer obtained by using a monomer as described above is a fluoropolymer which does not satisfy the requirement (2), unless Ch blocks are extremely many, Ch blocks can be reduced by a post fluorination method, whereby it is possible to obtain a fluoropolymer (A) which satisfies the above requirement (2). The fluoropolymer wherein Ch blocks are not extremely many, is a fluoropolymer obtainable by using the above-mentioned monomer which may form Ch blocks, and it is preferably a fluoropolymer obtained by using the above monomer by a polymerization method other than the method of polymerizing the monomer under such a polymerization condition that a head-to-head bond will hardly be formed. The post fluorination method is a method of fluorinating such a fluoropolymer at a relatively low temperature by fluorine ($F_2$), particularly by fluorine gas. The fluorination temperature is preferably at most 50° C., particularly preferably at most 30° C. The fluoropolymer may be contacted with fluorine in a solid state, or may be contacted with fluorine in a solution state.

By the post fluorination, the $CH_2CH_2$ portion in a polymer will easily be converted to CFHCFH, and hydrogen atoms bonded to other carbon atoms will be replaced by fluorine atoms. Thus, Ch blocks in the polymer will be reduced by the post fluorination, whereby a fluoropolymer (A) which satisfies the above-mentioned requirement (2), will be obtained. However, if the fluorination is permitted to further proceed, hydrogen atoms bonded to carbon atoms will decrease, and the number of hydrogen atom-bonded carbon atoms required for the light transmittance of the polymer will decrease. The degree of fluorination may be adjusted by the above-mentioned measurement of the NMR spectrum. Namely, the amount of Ch blocks can be measured by detecting signals appearing on the higher magnetic field side than 2.8 ppm, and the total amount of hydrogen atoms can be measured by detecting signals appearing at 2.8 ppm or on the lower magnetic field side than 2.8 ppm. Accordingly, by these measurements, it is possible to obtain a fluoropolymer (A) which has little Ch blocks and a necessary amount of hydrogen atoms, and which satisfies the above-mentioned requirements (1) and (2).

The fluoropolymer (A) usually has a residual group of the polymerization initiator or the chain transfer agent at a molecular terminal. If Ch blocks are present in such a residual group, such blocks are likely to present an adverse effect to some extent to the durability of the fluoropolymer (A). Therefore, it is also preferred that no Ch blocks are present in such a residual group. Accordingly, as a polymerization initiator or a chain transfer agent to be used for the polymerization, it is preferred to use a compound wherein no Ch blocks are present. Particularly, as the polymerization initiator, a compound having substantially no hydrogen atoms bonded to carbon atoms, is preferred. As the polymerization initiator, preferred is a polymerization initiator having substantially all hydrogen atoms bonded to carbon atoms, substituted by fluorine atoms (hereinafter referred to as a pefluoropolymerization initiator), and particularly preferred is a peroxide type perfluoropolymerization initiator. The following compounds may be mentioned as specific peroxide type perfluoropolymerization initiators.

$(C_3F_7COO)_2$
$\{C_3F_7OCF(CF_3)CF_2COO\}_2$
$\{C_3F_7OCF(CF_3)CF_2OCF(CF_3)CF_2COO\}_2$
$\{C_3F_7C(CF_3)_2O\}_2$

The present inventors have further found that the durability of the fluoropolymer (A) against a light having a wavelength of from 100 to 200 nm, will deteriorate by the presence of a chlorine component. The chlorine component means a chlorine atom bonded in the fluoropolymer (A), or a chlorine-containing compound or chlorine ions contained as impurities in the fluoropolymer (A). Accordingly, starting materials for a fluoropolymer (A), such as a monomer, a polymerization initiator, etc. are required to be compounds containing no chlorine. Further, such starting materials are preferably compounds which do not contain a chlorine-containing compound or chlorine ions as impurities, as far as possible. The above monomer (a) or monomer (b) is frequently produced from a compound in which two carbon atoms having chlorine atoms bonded thereto, are chained, by a dechlorination reaction to form a polymerizable unsaturated double bond. Accordingly, a monomer obtained by such a method should preferably be sufficiently purified before the polymerization to obtain a monomer containing no substantial amount of a chlorine component. Further, a subsidiary material to be used for the polymerization such as the after-mentioned polymerization medium, a treating medium to be used for treatment after the polymerization, a solvent to be used e.g. at the time of forming a film, an additive to be used as added to the fluoropolymer (A), etc. should also preferably be compounds containing little chlorine components.

Using the starting materials as described above, the fluoropolymer (A) is produced by a polymerization method such as bulk polymerization, solution polymerization, suspension polymerization or emulsion polymerization. Particularly preferred is a solution polymerization employing a polymerization medium. Further, when the above-mentioned post fluorination is carried out, it is usually carried out after the polymerization and before the film formation. The obtained fluoropolymer (A) is subjected to purification, etc., as the case requires, and used for the production of a pellicle membrane. A pellicle membrane is usually produced by using a solution having the fluoropolymer (A) dissolved in a solvent. the polymerization medium to be used for the above solution polymerization or the solvent to be used for the solution, is not particularly limited so long as it is capable of dissolving this polymer. However, it is preferably a fluorinated solvent providing a high solubility to the fluoropolymer (A). For example, the following fluorinated solvents may be employed.

Polyfluoroaromatic compounds such as perfluorobenzene, pentafluorobenzene and 1,3-bis(trifluoromethyl)benzene. Polyfluorotrialkylamine compounds such as perfluorotributylamine and perfluorotripropylamine. Polyfluorocycloalkane compounds such as perfluorodecalin and perfluorocyclohexane. Polyfluorocyclic ether compound such as perfluoro(2-butyltetrahydrofuran).

Polyfluoroalkanes such as perfluorooctane, perfluorodecane, 2H,3H-perfluoropentane and 1H-perfluorohexane. Polyfluoroethers such as methyl perfluoroisopropyl ether, methyl perfluorobutyl ether, methyl (perfluorohexylmethyl) ether, methyl perfluorooctyl ether and ethyl perfluorobutyl ether.

As a method of producing a pellicle membrane from a solution of the fluoropolymer (A), a method of forming a thin membrane of the polymer on a substrate by means of a method for forming a membrane from a solution, such as roll coating, casting, dip coating, spin coating, water casting, die coating or Langmuir Blodgett, may be employed. The thickness of the membrane is usually selected within a range of from 0.01 to 50 μm. In the case of a pellicle membrane, extremely strict membrane thickness control is required, and therefore it is more preferred to employ spin coating. As the substrate, preferred is a silicon wafer, quartz glass or the like having a smooth surface.

The present invention provides a pellicle having a pellicle membrane made of the above-described fluoropolymer (A), which is to be used for a photolithographic patterning process by means of a light having a wavelength of from 100 to 200 nm. This pellicle usually comprises a pellicle membrane and a frame, and preferably, the pellicle membrane and the frame are further bonded by an adhesive. The frame is usually a frame made of a material such as a metal, a ceramics or a rigid plastic. Particularly preferred is a frame made of a metal such as aluminum. The pellicle membrane is usually attached to the frame by an adhesive. The adhesive is made of a material capable of bonding the pellicle membrane to the frame and is preferably made of a material having durability against a light having a wavelength of from 100 to 200 nm, since during the exposure, the adhesive will also be exposed to this light, whereby the adhesive property is likely to deteriorate. As such an adhesive, a known adhesive may be employed which has a sufficient durability against a light having a wavelength of from 100 to 200 nm. For example, a fluoropolymer for an adhesive, as disclosed in the above-mentioned JP-A-2001-330943 or WO200137044, may be used.

The fluoropolymer (A) in the present invention has higher durability than a known fluoropolymer against a light having a wavelength of from 100 to 200 nm. Accordingly, the fluoropolymer (A) can be used also as an adhesive to bond a pellicle membrane to a frame to form a pellicle useful for a photolithographic patterning process by means of a light having a wavelength of from 100 to 200 nm. In the case of a pellicle employing this adhesive, the material for the pellicle membrane is not particularly limited, and this adhesive is useful for bonding to a frame a pellicle membrane made of a material which can be bonded by this adhesive. Preferably, it is used as an adhesive to bond to a frame a pellicle membrane made of the fluoropolymer (A). In such a case, the fluoropolymer (A) in the pellicle membrane may not necessarily be the same as the fluoropolymer (A) of the adhesive.

In a case where the fluoropolymer (A) is used as an adhesive, it is preferred to employ a fluoropolymer (A) in which functional groups effective to improve the adhesive property are introduced. Further, the fluoropolymer (A) for a pellicle membrane preferably has no functional group from the viewpoint of the light transmittance.

The functional groups in the functional group-containing fluoropolymer (A) are not particularly limited so long as they are ones capable of providing an adhesive property to the pellicle membrane and the frame. For example, carboxylic acid groups, sulfonic acid groups, groups having an ester bond, alkenyl groups, hydrolyzable silyl groups, hydroxyl groups, maleimide groups, amino groups, cyano groups or isocyanate groups may, for example, be mentioned. As such functional groups, carboxylic acid groups are particularly suitable from a viewpoint such that the adhesive property to a metal such as aluminum which is a common material for a frame, is good, the storage stability is good, and such effects can be obtained at a relatively low temperature.

The number of functional groups in the fluoropolymer (A) is preferably from 0.001 to 1 mmol per 1 g of the polymer. If the number of functional groups exceeds 1 mmol, the absorptivity which the functional groups have, is likely to impair the durability of the adhesive.

A method of introducing adhesive functional groups to a known fluoropolymer having a fluorinated alicyclic structure in its main chain, is known (JP-A-4-189880, JP-A-4-226177, JP-A-6-220232, JP-A-2001-330943). Also in the present invention, it is possible to produce a fluoropolymer (A) having adhesive functional groups introduced, by this known method. For example, there may be a method utilizing terminal groups of a polymer obtained by polymerization, a method of copolymerizing a monomer having an alkoxycarbonyl group and then hydrolyzing the obtained polymer, or a method of subjecting a polymer to high temperature treatment to oxidize and decompose side chains or terminals of the polymer to form functional groups.

Further, an adhesion-improving agent such as a coupling agent of silane type, epoxy type, titanium type or aluminum type may be incorporated to the fluoropolymer (A) to be used as an adhesive or to a functional group-containing fluoropolymer (A), in order to improve the adhesive property. Otherwise, a fluoropolymer (A) containing functional groups is coated thinly on a frame, and a fluoropolymer (A) having no functional group is placed thereon, whereupon a pellicle membrane is bonded thereon, whereby a strong adhesive strength can be obtained.

Now, the present invention will be described in further detail with reference to Examples. However, it should be understood that the present invention is by no means restricted to such specific Examples. The high resolution proton magnetic resonance apparatus used for the measurement of $^1$H-NMR in Examples, is JEOL α-600 (manufactured by Nippon Denshi K.K.), and the proton resonance frequency was 600 MHz. In the measurement of $^1$H-NMR, hexafluorobenzene was used as a solvent, and as a lock solvent, a small amount of hexa-deuterated benzene ($C_6D_6$) was added. As the standard for chemical shift, a very small amount of benzene contained in $C_6D_6$ was used.

EXAMPLE 1

Preparation Example for a Fluoropolymer 30 g of 1,1,2,4,4,5-hexafluoro-3-oxa-5-trifluoromethyl-1,6-heptadiene [$CH_2$=$CHCF(CF_3)CF_2OCF$=$CF_2$] and 80 g of 1H-perfluorohexane were put into an autoclave made of pressure resistant glass and having an internal capacity of 200 ml, flushed with nitrogen. As a polymerization initiator, 17 mg of bis(heptafluorobutyryl) peroxide was added, and the interior of the system was again flushed with nitrogen, whereupon polymerization was carried out at 0° C. for 72 hours. As a result, 24 g of a fluoropolymer having an alicyclic structure in its main chain (hereinafter referred to as polymer (A-1)) was obtained.

The intrinsic viscosity [η] of polymer (A-1) was 0.6 dl/g in perfluoro(2-butyltetrahydrofuran) at 30° C. The glass transition temperature of polymer (A-1) was 108° C. It was a tough and transparent vitreous polymer at room temperature, and the refractive index was low at a level of 1.34. $^1$H-NMR spectrum (600 MHz) of polymer (A-1) was measured, and the results are shown in FIG. 1. As shown in FIG. 1, no distinct signals were observed on the higher magnetic field side than 2.8 ppm.

EXAMPLE 2

Preparation Example for a Fluoropolymer 20 g of 1,1,2,4,4,5-hexafluoro-3-oxa-5-trifluoromethyl-1,6-heptadiene, 7.5 g of perfluoro(2,2-dimethyl-1,3-dioxol) and 80 g of 1H-perfluorohexane were put into an autoclave made of pressure resistant glass and having an internal capacity of 100 ml. As a polymerization initiator, 23 mg of bis(heptafluorobutyryl) peroxide was added. The interior of the system was again flushed with nitrogen, whereupon polymerization was carried out at 10° C. for 72 hours. As a result, 15 g of a fluoropolymer having an alicyclic structure in its main chain (hereinafter referred to as polymer (A-2)) was obtained.

The intrinsic viscosity [η] of polymer (A-2) was 0.62 dl/g in perfluoro(2-butyltetrahydrofuran) at 30° C. The polymer (A-2) was a tough and transparent vitreous polymer at room temperature. $^1$H-NMR spectrum (600 MHz) of polymer (A-2) was measured, whereby no distinct signals were observed on the higher magnetic field side than 2.8 ppm.

EXAMPLE 3

Preparation Example for a Fluoropolymer 24 g of 1,1,2,4,4,5-hexafluoro-3-oxa-5-trifluoromethyl-1,6-heptadiene and as a polymerization initiator, a mixture of 29 mg of bis(heptafluorobutyryl) peroxide and 70 g of 1H-perfluorohexane, were put into an autoclave made of pressure resistant glass and having an internal capacity of 200 ml. The interior of the system was flushed with nitrogen, whereupon 4.6 g of vinylidene fluoride was added to the gas phase portion. Then, polymerization was carried out at 10° C. for 72 hours. As a result, 11 g of a fluoropolymer having an alicyclic structure in its main chain (hereinafter referred to as polymer (A-3)) was obtained.

The intrinsic viscosity [η] of polymer (A-3) was 0.36 dl/g in perfluoro(2-butyltetrahydrofuran) at 30° C. The polymer (A-3) was a tough and transparent vitreous polymer at room temperature. $^1$H-NMR spectrum (600 MHz) of polymer (A-3) was measured, whereby slight signals were observed on the higher magnetic field side than 2.8 ppm. As a result of a calculation from this spectrum, the amount of hydrogen atoms corresponding to the higher magnetic field side signals, was 4.5 mol %, based on the total hydrogen atoms in the polymer.

EXAMPLE 4

Preparation Example for a Fluoropolymer 30 g of 1,1,2,4,4,5-hexafluoro-3-oxa-5-trifluoromethyl-1,6-heptadiene and 80 g of 1H-perfluorohexane were put into an autoclave made of pressure resistant glass and having an internal capacity of 200 ml, flushed with nitrogen. As a polymerization initiator, 7 mg of bis(heptafluorobutyryl) peroxide was added. The interior of the system was again flushed with nitrogen, whereupon polymerization was carried out at 25° C. for 40 hours. As a result, 25 g of a fluoropolymer having an alicyclic structure in its main chain (hereinafter referred to as polymer (A-4)) was obtained.

Figure 2:
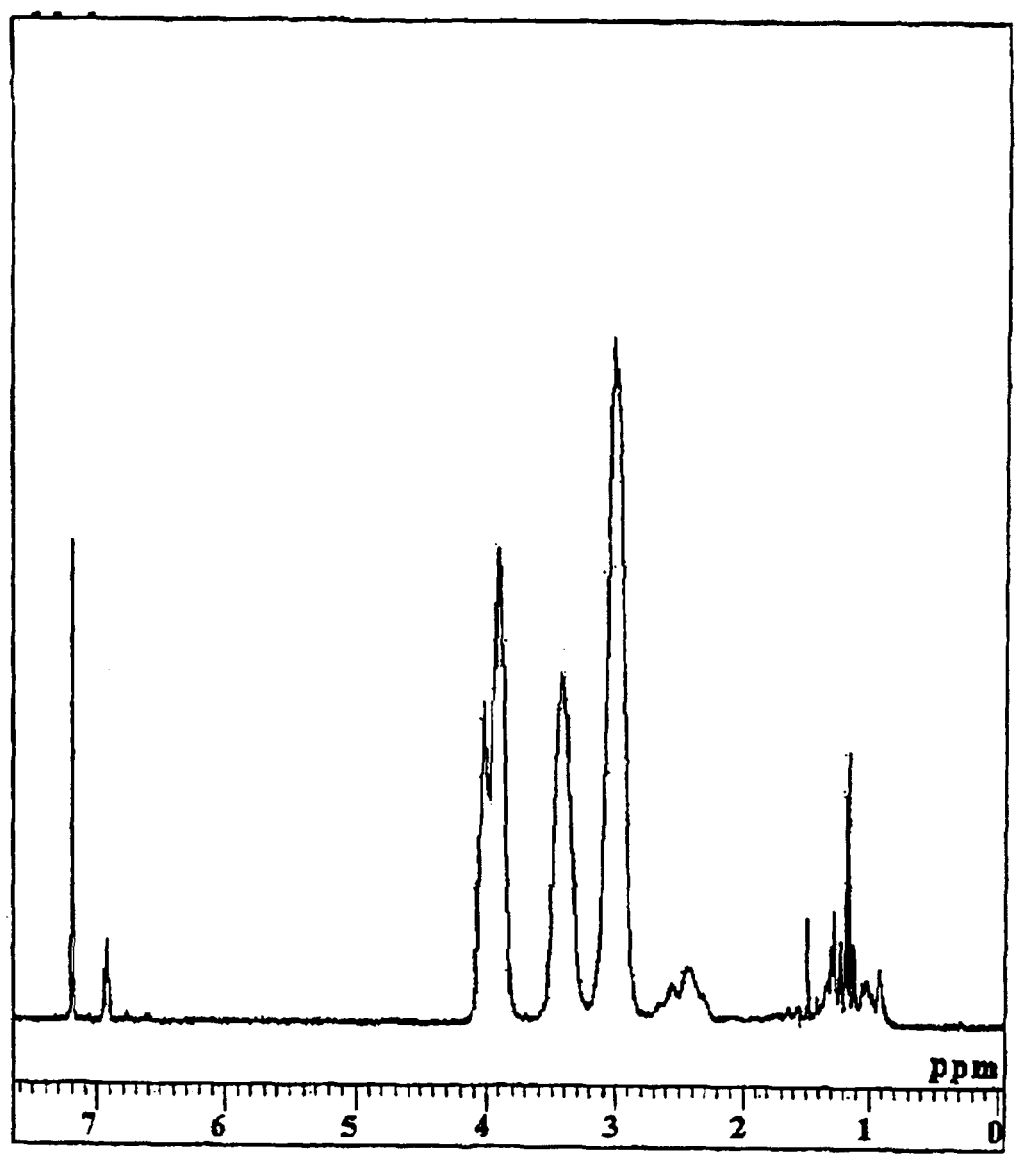
FIG. 2 is a spectrum chart showing the $^1$H-NMR spectrum of polymer (A-4).

The intrinsic viscosity [η] of polymer (A-4) was 0.56 dl/g in perfluoro(2-butyltetrahydrofuran) at 30° C. The glass transition temperature of polymer (A-4) was 108° C., and it was a tough and transparent vitreous polymer at room temperature. The refractive index was low at a level of 1.34. $^1$H-NMR spectrum (600 MHz) of polymer (A-4) was measured, and the results are shown in FIG. 2. As shown in FIG. 2, distinct signals were observed on the higher magnetic field side than 2.8 ppm. As a result of a calculation from this spectrum, the amount of hydrogen atoms corresponding to the higher magnetic field side signals, was 7 mol %, based on the total hydrogen atoms in the polymer.

5 g of obtained polymer (A-4) was dissolved in 95 g of perfluorotributylamine, and the solution was charged into an autoclave made of nickel and having an internal capacity of 1,000 ml, followed by three times of deaeration with nitrogen. Then, the interior of the system was vacuumed, and fluorine gas (20 mol %) diluted with nitrogen gas, was charged to a pressure of 0.3 MPa. Thereafter, stirring was carried out for one week at a temperature of from 20 to 25° C. Then, excess fluorine gas was purged, and the solution was taken out from the system, and the solvent was distilled off to obtain a partially fluorinated polymer (A-4). The obtained partially fluorinated polymer (A-4) will be hereinafter referred to as polymer (A-5).

Figure 3:
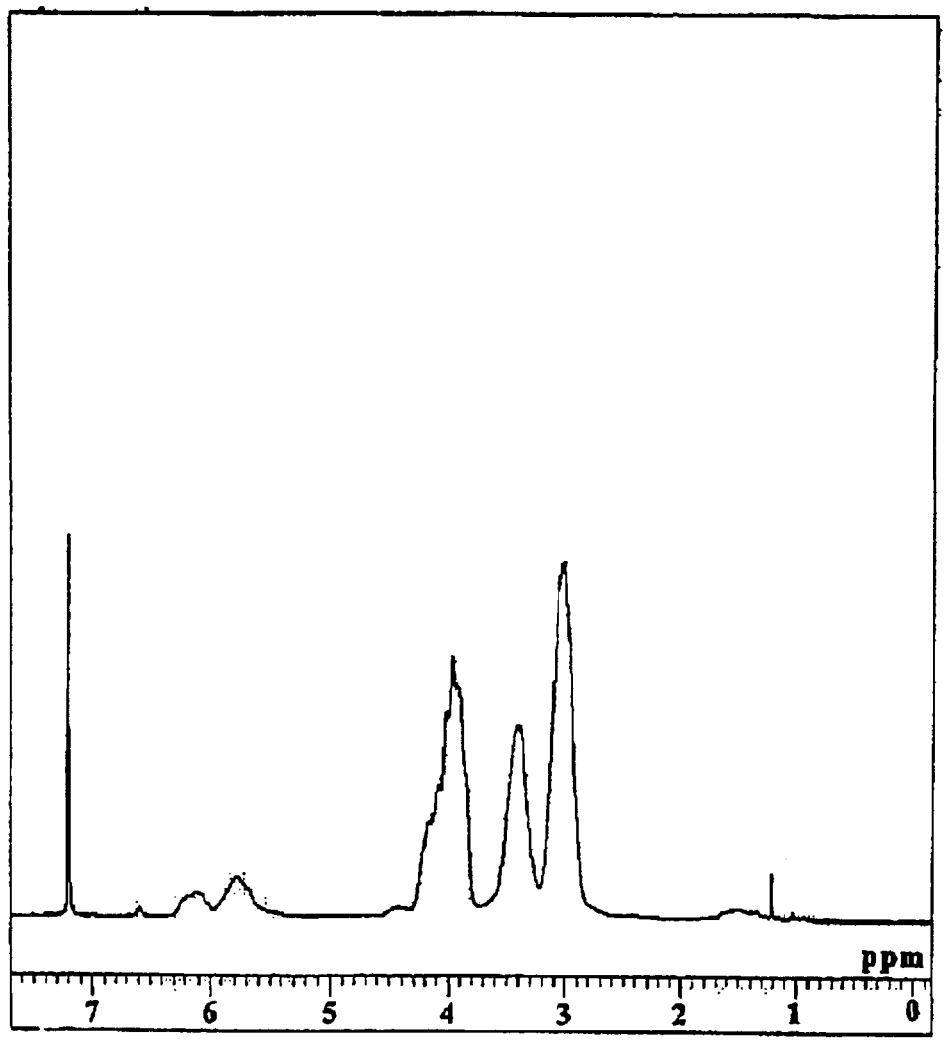
FIG. 3 is a spectrum chart showing the $^1$H-NMR spectrum of polymer (A-5).

The glass transition temperature of polymer (A-5) was 108° C., and it was a tough and transparent vitreous polymer at room temperature. $^1$H-NMR spectrum (600 MHz) of polymer (A-5) was measured, and the results are shown in FIG. 3. As shown in FIG. 3, no distinct signals as in FIG. 2 were observed on the higher magnetic field side than 2.8 ppm. Further, as is evident from the comparison with FIG. 1, in this polymer, an adequate amount of hydrogen atoms (hydrogen atoms bonded to carbon atoms in the main chain) were present.

EXAMPLE 5

Preparation Example for a Fluoropolymer 20 g of 1,1,2,4,4,5,5-heptafluoro-3-oxa-1,6-heptadiene [$CH_2$=$CHCF_2CF_2OCF$=$CF_2$] and 40 g of 1H-perfluorohexane were put into an autoclave made of pressure resistant glass and having an internal capacity of 200 ml. As a polymerization initiator, 20 mg of bis(heptafluorobutyryl) peroxide was added. The interior of the system was flushed with nitrogen, whereupon polymerization was carried out at 0° C. for 24 hours. As a result, 10 g of a fluoropolymer having an alicyclic structure in its main chain (hereinafter referred to as polymer (A-6)) was obtained.

The intrinsic viscosity [η] of polymer (A-6) was 0.90 dl/g in 1,3-bis(trifluoromethyl)benzene at 30° C. The glass transition point of polymer (A-6) was 90° C., and it was a tough and transparent vitreous polymer at room temperature. The refractive index was low at a level of 1.36. Further, $^1$H-NMR spectrum (600 MHz) of polymer (A-6) was measured, whereby no distinct signals were observed on the higher magnetic field side than 2.8 ppm.

On the other hand, polymer (A-6) obtained in the same method as described above, was heat-treated in air at 320° C. for 3 hours and then immersed in water and modified. By the measurement of IR spectrum of the modified polymer (A-6), a peak of carboxyl groups was ascertained, and the amount was 0.005 mmol/g. This modified polymer will be hereinafter referred to as adhesive (A-6).

EXAMPLE 6

Preparation Example for a Fluoropolymer 20 g of 1,1,2,4,4,5,5-heptafluoro-3-oxa-1,6-heptadiene and 40 g of 1H-perfluorohexane were put into an autoclave made of pressure resistant glass and having an internal capacity of 200 ml. As a polymerization initiator, 20 mg of bis(heptafluorobutyryl) peroxide was added. The interior of the system was flushed with nitrogen, whereupon polymerization was carried out at 40° C. for 10 hours. As a result, 15 g of a fluoropolymer having an alicyclic structure in its main chain (hereinafter referred to as polymer (A-7)) was obtained.

The intrinsic viscosity [η] of polymer (A-7) was 0.96 dl/g in 1,3-bis(trifluoromethyl)benzene at 30° C. The glass transition point of polymer (A-7) was 90° C., and it was a tough and transparent vitreous polymer at room temperature. The refractive index was low at a level of 1.36. $^1$H-NMR spectrum (600 MHz) of polymer (A-7) was measured, whereby distinct signals were observed on the higher magnetic field side than 2.8 ppm. As a result of a calculation from this spectrum, the amount of hydrogen atom corresponding to the signals, was 6.5 mol % based on the total hydrogen atoms in the polymer.

On the other hand, polymer (A-7) obtained in the same method as described above, was heat-treated in air at 320° C. for 3 hours and then immersed in water and modified. By the measurement of IR spectrum of the modified polymer (A-7), a peak of carboxyl groups was ascertained, and the amount was 0.004 mmol/g. This modified polymer (A-7) will be hereinafter referred to as adhesive (A-7).

EXAMPLE 7

Preparation and Evaluation of a Pellicle 7 g of polymer (A-1) and 93 g of perfluorotributylamine were put into a glass flask and heated and stirred at 40° C.

for 24 hours. As a result, a colorless transparent uniform solution without turbidity was obtained. This solution was coated on a polished quartz substrate by spin coating for 10 seconds at a spinning speed of 500 rpm and then for 20 seconds at 2,000 rpm, followed by heat treatment for one hour at 80° C. and further for one hour at 180° C. to obtain a uniform transparent membrane of polymer (A-1) on the quartz substrate.

On the other hand, a solution obtained by treating 7 g of adhesive (A-6) and 93 g of 1,3-bis(trifluoromethyl)benzene in the same manner as described above, was coated on the side of an aluminum frame on which a pellicle membrane was to be bonded, followed by drying at room temperature for two hours. Then, the aluminum frame was put on a hot plate at 120° C. so that the adhesive surface turned up, followed by heating for 10 minutes, and the above quartz substrate having the membrane of polymer (A-1) formed thereon was overlaid and press-bonded so that the membrane surface was in contact with the adhesive surface of the frame. The assembly was held at 120° C. for 10 minutes in that state to complete bonding. Then, the membrane was separated from the quartz substrate to obtain a pellicle having a uniform self-supporting membrane of about 1 μm in thickness made of polymer (A-1), bonded to the aluminum frame.

Using adhesive (A-6) and four types of solutions having 7 g of each of polymers (A-2) to (A-5) dissolved in 93 g of perfluorotributylamine, pellicles each having a uniform self-supporting membrane of about 1 μm in thickness made of each polymer, bonded on an aluminum frame, were obtained in the same manner as described above. Each of these membranes had a transmittance of light with a wavelength of 157 nm of at least 98%.

Each of the pellicles having membranes made of polymers (A-2) to (A-5) was subjected to an irradiation test by means of a $F_2$ excimer laser light having a wavelength of 157 nm, to be used for photolithography, with an intensity of 0.1 mJ/pulse at a cycle of 50 Hz, whereby each of pellicle membranes made of polymers (A-2), (A-3) and (A-5) showed excellent durability without no substantial decrease in transmittance with at least 100,000 pulses. On the other hand, with the pellicle membrane made of polymer (A-4), a decrease in the transmittance was observed at a level of 40,000 pulses, and the durability was inadequate. Further, with each pellicle, no peeling of the membrane was observed, and the adhesive (A-6) showed good durability.

EXAMPLE 8

A pellicle having a thin membrane of 1 μm in thickness made of polymer (A-4), bonded to an aluminum frame, was prepared in the same manner as in Example 7 except that polymer (A-4) was used as the polymer, and the adhesive (A-7) was used as the adhesive.

This pellicle was subjected to an irradiation test by means of a $F_2$ excimer laser light having a wavelength of 157 nm, to be used for photolithography, with an intensity of 0.1 mJ/pulse at a cycle of 50 Hz, whereby with the pellicle membrane made of polymer (A-4), not only a decrease in the transmittance was observed at a level of 40,000 pulses, but also peeling of the membrane was observed, and the durability of adhesive (A-7) was also inadequate.

As described in the foregoing, the pellicle employing the fluoropolymer (A) of the present invention not only provides a high transmittance in a wavelength region of from 100 to 200 nm but also exhibits high durability against an excimer laser light having such a wavelength, to be used for finer processing in future. Thus, it has excellent effects as a pellicle to be used for photolithography of next generation.

The entire disclosure of Japanese Patent Application No. 2002-243867 filed on Aug. 23, 2002 including specification, claims, drawings and summary is incorporated herein by reference in its entirety.

What is claimed is:

1. A pellicle for a photolithographic patterning process using a light having a wavelength of from 100 to 200 nm, said pellicle comprising:
    a pellicle membrane comprising (A) a substantially linear fluoropolymer which has an alicyclic structure in its main chain, the main chain being a chain of carbon atoms, and said fluoropolymer satisfying the following requirements (1) and (2):
    (1) the carbon atoms in the main chain of said fluoropolymer comprise a carbon atom having at least one hydrogen atom bonded thereto and a carbon atom having no hydrogen atom bonded thereto; and
    (2) in the measurement of a high resolution proton magnetic resonance spectrum, of said fluoropolymer, a number of hydrogen atoms based on signals appearing on a magnetic field side higher than 2.8 ppm, is at most 6 mol % based on a total number of hydrogen atoms.

2. The pellicle according to claim 1, wherein the fluoropolymer (A) has substantially no signals appearing on the magnetic field side higher than 2.8 ppm in the measurement of the high resolution proton magnetic resonance spectrum.

3. The pellicle according to claim 1, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

4. The pellicle according to claim 2, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

5. The pellicle according to claim 1, wherein the fluoropolymer (A) is obtained by cyclopolymerization of a diene monomer represented by the following formula (11-1), or by copolymerizing a diene monomer represented by the following formula (11-1) with at least one monoene monomer having no or one hydrogen atom-bonded carbon atom, as a carbon atom of a polymerizable unsaturated group, provided that the polymerization of the diene monomer is a cyclic polymerization:

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

6. The pellicle according to claim 5, wherein the fluoropolymer (A) is obtained by carrying out the polymerization at a temperature of at most 15° C.

7. The pellicle according to claim 1, wherein the fluoropolymer (A) is obtained by fluorinating a fluoropolymer having the same structure as the fluoropolymer (A) except that it does not satisfy the requirement (2), to have some of hydrogen atoms bonded to carbon atoms substituted by fluorine atoms.

8. A pellicle for a photolithographic patterning process using a light having a wavelength of from 100 to 200 nm, said pellicle comprising:
a pellicle membrane,
a frame supporting the pellicle membrane, and
an adhesive bonding the pellicle membrane to the frame,
wherein the adhesive comprising (A)
a substantially linear fluoropolymer which has an alicyclic structure in its main chain, the main chain being a chain of carbon atoms, and said fluoropolymer satisfying the following requirements (1) and (2):
(1) the carbon atoms in the main chain comprise a carbon atom having at least one hydrogen atom bonded thereto and a carbon atom having no hydrogen atom bonded thereto; and
(2) in the measurement of a high resolution proton magnetic resonance spectrum of said fluoropolymer, a number of hydrogen atoms based on signals appearing on a magnetic field side higher than 2.8 ppm, is at most 6 mol % based on a total number of hydrogen atoms.

9. The pellicle according to claim 8, wherein the fluoropolymer (A) has substantially no signals appearing on the magnetic field side higher than 2.8 ppm in the measurement of the high resolution proton magnetic resonance spectrum.

10. The pellicle according to claim 8, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

11. The pellicle according to claim 9, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

12. The pellicle according to claim 8, wherein the fluoropolymer (A) is obtained by cyclopolymerization of a diene monomer represented by the following formula (11-1), or
by copolymerizing a diene monomer represented by the following formula (11-1) with at least one monoene monomer having no or one hydrogen atom-bonded carbon atom, as a carbon atom of a polymerizable unsaturated group, provided that the polymerization of the diene monomer is a cyclic polymerization:

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

13. The pellicle according to claim 12, wherein the fluoropolymer (A) is obtained by carrying out the polymerization at a temperature of at most 15° C.

14. The pellicle according to claim 8, wherein the fluoropolymer (A) is obtained by fluorinating a fluoropolymer having the same structure as the fluoropolymer (A) except that it does not satisfy the requirement (2), to have some of hydrogen atoms bonded to carbon atoms substituted by fluorine atoms.

15. A pellicle for a photolithographic patterning process using a light having a wavelength of from 100 to 200 nm, said pellicle comprising:
a pellicle membrane,
a frame supporting the pellicle membrane, and
an adhesive bonding the pellicle membrane to the frame,
wherein the pellicle membrane and the adhesive comprise (A) a substantially linear fluoropolymer which has an alicyclic structure in its main chain, the main chain being a chain of carbon atoms, and said fluoropolymer satisfying the following requirements (1) and (2):
(1) the carbon atoms in the main of said fluoropolymer chain comprise a carbon atom having at least one hydrogen atom bonded thereto and a carbon atom having no hydrogen atom bonded thereto; and
(2) in the measurement of a high resolution proton magnetic resonance spectrum of said fluoropolymer, a number of hydrogen atoms based on signals appearing on a magnetic field side higher than 2.8 ppm, is at most 6 mol % based on a total number of hydrogen atoms.

16. The pellicle according to claim 15, wherein the fluoropolymer (A) has substantially no signals appearing on the higher magnetic field side than 2.8 ppm in the measurement of the high resolution proton magnetic resonance spectrum.

17. The pellicle according to claim 15, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

18. The pellicle according to claim 16, wherein the fluoropolymer (A) contains monomer units formed by cyclopolymerization of a diene monomer represented by the following formula (11-1):

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

19. The pellicle according to claim 15, wherein the fluoropolymer (A) is obtained by cyclopolymerization of a diene monomer represented by the following formula (11-1), or
by copolymerizing a diene monomer represented by the following formula (11-1) with at least one monoene monomer having no or one hydrogen atom-bonded carbon atom, as a carbon atom of a polymerizable unsaturated group, provided that the polymerization of the diene monomer is a cyclic polymerization:

$$CH_2=CH-R^f-O-CR^{15}=CF_2 \qquad (11\text{-}1)$$

wherein $R^{15}$ is a fluorine atom or a trifluoromethyl group, and $R^f$ is a $C_{1-4}$ perfluoroalkylene group.

20. The pellicle according to claim 19, wherein the fluoropolymer (A) is obtained by carrying out the polymerization at a temperature of at most 15° C.

21. The pellicle according to claim 15, wherein the fluoropolymer (A) is obtained by fluorinating a fluoropolymer having the same structure as the fluoropolymer (A) except that it does not satisfy the requirement (2), to have some of hydrogen atoms bonded to carbon atoms substituted by fluorine atoms.

* * * * *